US010389278B2

United States Patent
Moriya et al.

(10) Patent No.: US 10,389,278 B2
(45) Date of Patent: Aug. 20, 2019

(54) ELECTROSTATIC CHUCK DEVICE WITH MULTIPLE FINE PROTRUSIONS OR MULTIPLE FINE RECESSES

(71) Applicant: SUMITOMO OSAKA CEMENT CO., LTD., Tokyo (JP)

(72) Inventors: Yoshiaki Moriya, Tokyo (JP); Kazuto Ando, Tokyo (JP)

(73) Assignee: Sumitomo Osaka Cement Co., Ltd., Tokyo (JP)

( * ) Notice: Subject to any disclaimer, the term of this patent is extended or adjusted under 35 U.S.C. 154(b) by 221 days.

(21) Appl. No.: 14/776,787

(22) PCT Filed: Mar. 11, 2014

(86) PCT No.: PCT/JP2014/056364
§ 371 (c)(1),
(2) Date: Sep. 15, 2015

(87) PCT Pub. No.: WO2014/156619
PCT Pub. Date: Oct. 2, 2014

(65) Prior Publication Data
US 2016/0036355 A1    Feb. 4, 2016

(30) Foreign Application Priority Data
Mar. 29, 2013 (JP) .................. 2013-071739

(51) Int. Cl.
*H02N 13/00*    (2006.01)
*H01L 21/683*    (2006.01)
*H01L 21/687*    (2006.01)

(52) U.S. Cl.
CPC ......... *H02N 13/00* (2013.01); *H01L 21/6831* (2013.01); *H01L 21/6875* (2013.01)

(58) Field of Classification Search
CPC . H01L 21/6833; H01L 21/6831; H01L 21/68; H01L 21/67109; H01L 41/45;
(Continued)

(56) References Cited

U.S. PATENT DOCUMENTS 5,886,863 A * 3/1999 Nagasaki ............ H01L 21/6831
279/128
6,768,627 B1 * 7/2004 Kitabayashi ............. B23Q 3/15
361/234
(Continued)

FOREIGN PATENT DOCUMENTS

CN    1365518 A    8/2002
JP    05-205997 A    8/1993
(Continued)

OTHER PUBLICATIONS

Japanese Patent Office, International Search Report issued in corresponding International Patent Application No. PCT/JP2014/056364 and English-language translation dated Apr. 22, 2014.
(Continued)

*Primary Examiner* — Thienvu V Tran
*Assistant Examiner* — Nicolas Bellido
(74) *Attorney, Agent, or Firm* — Wood Herron & Evans LLP

(57) ABSTRACT

Provided is an electrostatic chuck device in which the attachment of particles to the rear surface of a plate-like specimen can be further suppressed by suppressing the generation source of the particles and, furthermore, an effect of cooling the plate-like specimen using a cooling gas can be improved. The electrostatic chuck device is formed by including an electrostatic chuck portion in which an upper surface (2a) of a ceramic plate-like body (2) is used as a placement surface on which a wafer is placed and an electrostatic adsorption electrode is provided inside the
(Continued)

ceramic plate-like body (2) or on the rear surface thereof, multiple protrusions (11) are formed on the upper surface (2a), and multiple fine protrusions (13) are formed in regions (12) excluding the multiple protrusions (11) in the upper surface (2a).

6 Claims, 4 Drawing Sheets

(58) Field of Classification Search
CPC .............. H01L 21/683; H01L 21/6875; G03F 7/70708; G03F 1/82; H01G 7/023; H01G 7/02; H01H 59/0009; H02N 13/00; H05F 3/00; C23C 16/00; B23Q 3/15; B82Y 10/00; B82Y 40/00; Y10T 279/23
USPC .... 361/234, 233, 145, 230, 235; 279/298.08
See application file for complete search history.

(56) References Cited

U.S. PATENT DOCUMENTS

| | | | | |
|---|---|---|---|---|
| 6,863,281 | B2* | 3/2005 | Endou | B23Q 3/154 |
| | | | | 279/128 |
| 7,072,166 | B2* | 7/2006 | Qin | H01L 21/6833 |
| | | | | 361/234 |
| 7,292,426 | B2* | 11/2007 | Ito | G03F 7/70708 |
| | | | | 361/234 |
| 2001/0054389 | A1 | 12/2001 | Sago et al. | |
| 2002/0036373 | A1* | 3/2002 | Kosakai | B25B 11/005 |
| | | | | 269/21 |
| 2005/0014386 | A1* | 1/2005 | Yoneda | H01L 21/6875 |
| | | | | 438/759 |
| 2007/0217114 | A1* | 9/2007 | Sasaki | C23C 14/505 |
| | | | | 361/145 |
| 2009/0047794 | A1* | 2/2009 | Ogawa | H01L 21/31138 |
| | | | | 438/725 |
| 2009/0097184 | A1 | 4/2009 | Buchberger, Jr. et al. | |
| 2010/0034911 | A1* | 2/2010 | Mori | B29C 35/0888 |
| | | | | 425/89 |
| 2018/0204747 | A1* | 7/2018 | Knyazik | H01L 21/67109 |

FOREIGN PATENT DOCUMENTS

| | | | | |
|---|---|---|---|---|
| JP | 05-087177 | B | | 12/1993 |
| JP | 09-283606 | A | | 10/1997 |
| JP | 10242255 | A | * | 9/1998 |
| JP | 3095514 | B2 | * | 10/2000 ............ G03F 7/707 |
| JP | 2006049352 | A | * | 2/2006 |
| JP | 2007-207842 | A | | 8/2007 |
| JP | 2011-077303 | A | | 4/2011 |
| JP | 2011077303 | A | * | 4/2011 |
| JP | 4739039 | B | | 8/2011 |

OTHER PUBLICATIONS

Chinese Patent Office, Office Action issued in corresponding Chinese Patent Application No. 201480017944.8 dated Mar. 29, 2017, 15 pages.

\* cited by examiner

ELECTROSTATIC CHUCK DEVICE WITH MULTIPLE FINE PROTRUSIONS OR MULTIPLE FINE RECESSES

TECHNICAL FIELD

The present invention relates to an electrostatic chuck device and, in more detail, to an electrostatic chuck device preferably used to carry out a treatment such as plasma etching on a semiconductor substrate such as a silicon wafer.

The present application claims priority on the basis of Japanese Patent Application No. 2013-071739, filed on Mar. 29, 2013, the content of which is incorporated herein by reference.

BACKGROUND ART

Recently, in the semiconductor industry supporting rapidly-developing IT technologies, there has been a demand for the higher integration or better performance of an element and, accordingly, in processes for manufacturing a semiconductor as well, there has been a demand for additional improvement in fine processing techniques. Among these processes for manufacturing a semiconductor, etching techniques are one of the important fine processing techniques and, in recent years, among the etching techniques, a plasma etching technique capable of highly efficient fine processing of a large area has become mainstream.

For example, in a process of manufacturing an LSI using a silicon wafer, the plasma etching technique is a technique for forming a fine pattern on a silicon wafer by forming a mask pattern on the silicon wafer using a resist, introducing a reactive gas into a vacuum in a state in which the silicon wafer is supported in the vacuum, applying a high-frequency electric field to the reactive gas so as to cause accelerated electrons to collide with gas molecules which are thus brought into a plasma state, and reacting radicals (free radicals) and ions generated from the plasma with the silicon wafer so as to remove the radicals and the ions as products of the reaction.

In an apparatus for manufacturing a semiconductor such as a plasma etching apparatus, as a device for placing and fixing a silicon wafer onto a specimen stage in a simple manner and maintaining the silicon wafer at a desired temperature, an electrostatic chuck device has been used so far (Patent Literature 1 and 2).

Meanwhile, in the above-described electrostatic chuck device, there are problems of weak resistance to oxygen-based plasma or corrosive gas and a concern of possible damage caused by discharging and the like during the use of the electrostatic chuck device and thus there has been a proposal for an electrostatic chuck device in which an electrostatic adsorption electrode is provided on the lower surface of a ceramic plate-like body, an insulating layer is adhered to the electrostatic adsorption electrode through an organic adhesive layer, and abase plate is adhered to the insulating layer through an organic adhesive layer (Patent Literature 3).

Meanwhile, as an electrostatic chuck device in which the thermal conduction characteristics do not significantly change between the electrostatic chuck device and a plate-like specimen, only a small number of particles are generated, and the attachment of particles to the rear surface of the plate-like specimen can be decreased, there has been a proposal of an electrostatic chuck device in which multiple protrusions are provided on a placement surface on which the plate-like specimen is placed and one or more fine protrusions are provided on the top surfaces of part or all of the protrusions (Patent Literature 4).

CITATION LIST

Patent Literature

[Patent Literature No. 1] Japanese Examined Patent Publication No. 5-87177

[Patent Literature No. 2] Japanese Laid-open Patent Publication No. 9-283606

[Patent Literature No. 3] Japanese Laid-open Patent Publication No. 2011-077303

[Patent Literature No. 4] Japanese Patent No. 4739039

SUMMARY OF INVENTION

Technical Problem

By the way, the electrostatic chuck device of the related art in which multiple protrusions are provided on an adsorption surface and one or more fine protrusions are provided on the top surfaces of part or all of the protrusions has been effective against the abnormal heat generation in a part of a plate-like specimen since impurities, contaminants, and the like attached to the rear surface of the plate-like specimen come in between the plate-like specimen and the top surfaces of the protrusions; however, as is expected, there have been problems in that particles are generated from coarse portions in the adsorption surface except for the protrusions and the particles are attached to the rear surface of the plate-like specimen. This phenomenon significantly appears after plasma cleaning.

In addition, in plasma etching, plasma cleaning, and the like, there has been a problem in that the cooling effect of a cooling gas with respect to the incidence of plasma heat into the plate-like specimen, that is, the effect of conducting heat to the coarse adsorption surface, is not sufficient.

The present invention has been made to solve the above-described problems, and an object of the present invention is to provide an electrostatic chuck device in which the attachment of particles to the rear surface of a plate-like specimen can be further suppressed by suppressing the generation source of the particles and, furthermore, an effect of cooling the plate-like specimen using a cooling gas can be improved.

Solution to Problem

As a result of intensive studies for solving the above-described problems, the present inventors found that, when multiple protrusions are formed on one main surface of a ceramic plate-like body, which is a placement surface for a plate-like specimen, and multiple fine protrusions or multiple fine recesses are formed in regions excluding the multiple protrusions on the above-described one main surface, the fine protrusions or the fine recesses suppress the generation source of particles, accordingly, the attachment of particles to the rear surface of the plate-like specimen is suppressed, and furthermore, an effect of cooling the plate-like specimen using a cooling gas can be improved, and the present inventors completed the present invention.

That is, according to the present invention, there is provided an electrostatic chuck device formed by including an electrostatic chuck portion in which one main surface of a ceramic plate-like body is used as a placement surface on which a plate-like specimen is placed and an electrostatic adsorption electrode is provided inside the ceramic plate-like body or on an other main surface thereof, in which multiple protrusions are formed on the one main surface, and multiple fine protrusions or multiple fine recesses are formed in regions excluding the multiple protrusions on the one main surface.

The total occupancy area of the multiple fine protrusions or the multiple fine recesses in the regions excluding the multiple protrusions on the one main surface is preferably in a range of 1% or more and 40% or less of an area of the regions.

The height of the fine protrusion or the depth of the fine recess is preferably in a range of 10% or more and 100% or less of the height of the protrusion.

Multiple second fine protrusions are preferably formed on individual top end portions of the multiple protrusions.

The surface roughness Ra of regions excluding the multiple protrusions on the one main surface is preferably greater than 1 μm.

It is preferable that the electrostatic chuck portion includes the electrostatic adsorption electrode on the other main surface of the ceramic plate-like body, a sheet-shaped or film-shaped insulating layer is adhered to the electrostatic adsorption electrode through a sheet-shaped or film-shaped first organic adhesive layer, and a base plate supporting the ceramic plate-like body is adhered to the insulating layer through a second organic adhesive layer.

Advantageous Effects of Invention

According to the electrostatic chuck device of the present invention, since the multiple protrusions are formed on the one main surface of the ceramic plate-like body, which is the placement surface for a plate-like specimen, and the multiple fine protrusions or the multiple fine recesses are formed in the regions excluding the multiple protrusions on the above-described one main surface, it is possible to suppress the generation of particles using the fine protrusions or the fine recesses, and accordingly, it is possible to further suppress the attachment of particles to the rear surface of the plate-like specimen. Furthermore, it is possible to improve the effect of cooling the plate-like specimen using a cooling gas.

In addition, when the electrostatic chuck portion is given a constitution in which the electrostatic adsorption electrode is provided on the other main surface of the ceramic plate-like body, the sheet-shaped or film-shaped insulating layer is adhered to the electrostatic adsorption electrode through the sheet-shaped or film-shaped first organic adhesive layer, and the base plate supporting the ceramic plate-like body is adhered to the insulating layer through the second organic adhesive layer, the electrostatic adsorption electrode is doubly protected with the first organic adhesive layer and the sheet-shaped or film-shaped insulating layer, and thus it is possible to improve the insulating resistance of the base plate and the side surface. Therefore, the frequency of breakage due to discharging or the like during use is low, and it is also possible to decrease the amount of particles generated in case of breakage.

DESCRIPTION OF EMBODIMENTS

Embodiments for implementing an electrostatic chuck device of the present invention will be described on the basis of the accompanying drawings.

Meanwhile, the embodiments are specific descriptions for better understanding the gist of the present invention and do not limit the present invention unless particularly otherwise described.

First Embodiment

Figure 1:
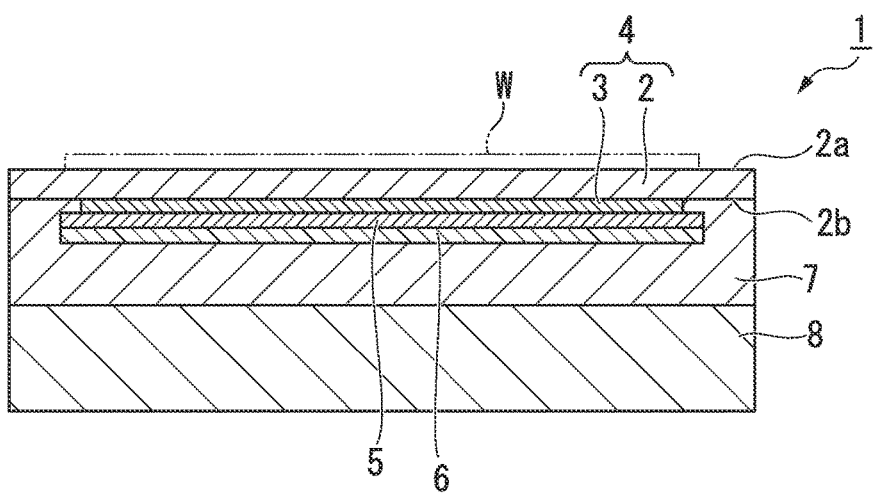
FIG. 1 is a sectional view illustrating an electrostatic chuck device of a first embodiment of the present invention.
Figure 2:
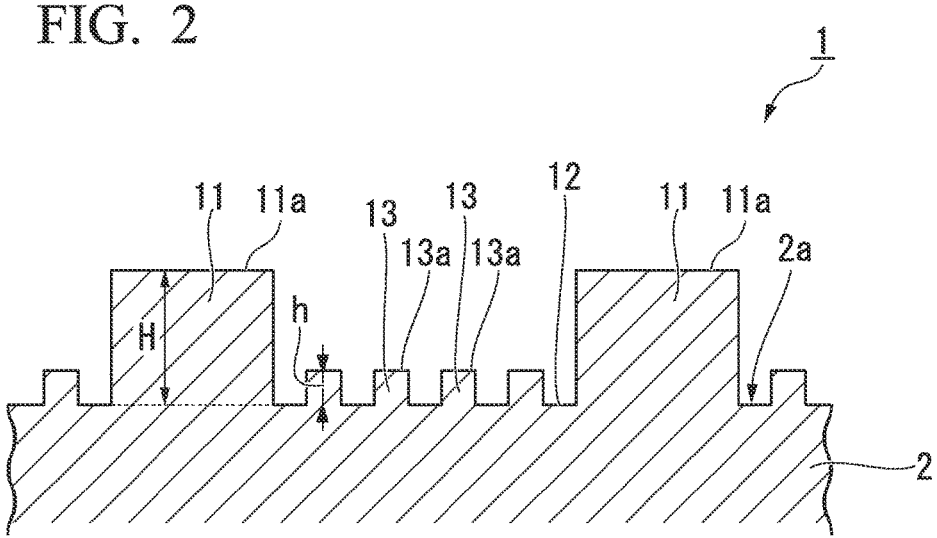
FIG. 2 is an enlarged sectional view illustrating periphery of the upper surface of a ceramic plate-like body in the electrostatic chuck device of the first embodiment of the present invention.

FIG. 1 is a sectional view illustrating an electrostatic chuck device of a first embodiment of the present invention, and FIG. 2 is an enlarged sectional view illustrating the periphery of the upper surface of a ceramic plate-like body in the same electrostatic chuck device.

In an electrostatic chuck device 1, an electrostatic chuck portion 4 is constituted with a ceramic plate-like body 2 having an upper surface (one main surface) 2a used as a placement surface on which a wafer (plate-like specimen) W is placed and an electrostatic adsorption electrode 3 provided on the lower surface (other main surface) 2b side of the ceramic plate-like body 2.

A sheet-shaped or film-shaped insulating layer 6 is adhered to the electrostatic adsorption electrode 3 through a sheet-shaped or film-shaped (first) organic adhesive layer 5, and a base portion (base plate) 8 supporting the electrostatic chuck portion 4 and cooling the wafer W is adhered to the sheet-shaped or film-shaped insulating layer 6 and the electrostatic chuck portion 4 through a (second) organic adhesive layer 7.

The upper surface 2a of the ceramic plate-like body 2 is provided with multiple protrusions 11 as illustrated in FIG. 2.

Hereinafter, the electrostatic chuck device 1 will be described in detail.

The ceramic plate-like body 2 is a disc-shaped ceramic body having an upper surface 2a that is used as a placement surface on which a variety of wafers W such as a silicon wafer are placed and is made of an insulating ceramic sintered body.

This ceramic body is not particularly limited as long as the ceramic body has a volume intrinsic resistivity in a range of approximately $10^{13}$ Ω·cm to $10^{15}$ Ω·cm, has mechanical strength, and furthermore, has durability against oxygen-based plasma or corrosive gas, and, for example, a variety of sintered bodies such as an alumina ($Al_2O_3$) sintered body, an aluminum nitride (AlN) sintered body, and an alumina ($Al_2O_3$)-silicon carbide (SiC) composite sintered body, yttrium compounds such as yttrium oxide ($Y_2O_3$), yttrium aluminum garnet (YAG), yttrium aluminum monoclinic (YAM), and yttrium aluminum perovskite (YAP), solid solutions containing a rare earth element (La, Ce, Pr, Nd, Pm, Sm, Eu, Gd, Tb, Dy, Ho, Er, Tm, Yb, or Lu), and the like can be preferably used.

When the above-described ceramic body is used, the plasma resistance to oxygen-based plasma and corrosion resistance to corrosive gas are improved, the mechanical strength is also improved, and the generation of particles is suppressed.

The thickness of the ceramic plate-like body 2 is preferably in a range of 0.3 mm or more and 2.0 mm or less. This is because, when the thickness of the ceramic plate-like body 2 is below 0.3 mm, it is not possible to ensure the mechanical strength of the ceramic plate-like body 2 and, on the other hand, when the thickness of the ceramic plate-like body 2 is above 2.0 mm, the distance between the electrode surface and the adsorption surface is increased, the adsorption force is weakened, the heat capacity of the ceramic plate-like body 2 is increased, the heat exchange efficiency of the wafer W to be placed thereon is decreased, and it becomes difficult to maintain the in-plane temperature of the wafer W in a desired temperature pattern.

The surface roughness Ra of regions 12 excluding the multiple protrusions 11 in the upper surface 2a of the ceramic plate-like body 2 is preferably greater than 1 μm and more preferably greater than 2 μm.

Here, the reason for setting the surface roughness Ra of the regions 12 excluding the multiple protrusions 11 in the upper surface 2a to greater than 1 μm is that, when the surface roughness Ra is 1 μm or less, the heat conduction effect on the upper surface 2a becomes insufficient, which is not preferable.

In the ceramic plate-like body 2, as illustrated in FIG. 2, multiple columnar protrusions 11 having a substantially circular sectional shape along the upper surface 2a are provided on the upper surface 2a, for example, in a grid shape at equal intervals or in a concentric shape at equal intervals.

The diameter of the protrusion 11 is preferably 0.5 mm or greater and more preferably 0.7 mm or greater. In addition, the height of the protrusion 11 is preferably 15 μm or greater and more preferably 30 μm or greater.

This protrusion 11 is not particularly limited as long as the protrusion has a volume intrinsic resistivity in a range of approximately $10^{13}$ Ω·cm to $10^{15}$ Ω·cm, has mechanical strength, and furthermore, has durability against oxygen-based plasma or corrosive gas, and the protrusion is preferably made of the same material as the ceramic plate-like body 2 when thermal expansion difference, mechanical strength, ease of grinding processing, and the like are taken into account.

As the above-described material, for example, a variety of sintered bodies such as an alumina ($Al_2O_3$) sintered body, an aluminum nitride (AlN) sintered body, and an alumina ($Al_2O_3$)-silicon carbide (SiC) composite sintered body, yttrium compounds such as yttrium oxide ($Y_2O_3$), yttrium aluminum garnet (YAG), yttrium aluminum monoclinic (YAM), and yttrium aluminum perovskite (YAP), solid solutions containing a rare earth element (La, Ce, Pr, Nd, Pm, Sm, Eu, Gd, Tb, Dy, Ho, Er, Tm, Yb, or Lu), and the like can be preferably used.

The occupancy area of the protrusions 11 on the upper surface 2a is preferably $2.1 \times 10^4$ $mm^2$ or less and more preferably $1.0 \times 10^4$ $mm^2$ or greater and $2.0 \times 10^4$ $mm^2$ or less.

This is because, when the occupancy area of the protrusions 11 on the upper surface 2a exceeds $2.1 \times 10^4$ $mm^2$, in response to the deformation of the wafer W during the adsorption and desorption of the wafer W, the protrusions 11 and the wafer W come into contact with each other in the peripheral portions of the protrusions 11, which increases the amount of a foreign substance attached to the wafer W, and, when a cooling gas such as helium is introduced into between the upper surface 2a of the ceramic plate-like body 2 and the wafer W, a temperature variation is caused between the portions of the wafer W on the protrusions 11 and the portions of the wafer W which are not on the protrusions 11.

In the regions 12 excluding the protrusions 11 in the upper surface 2a of the ceramic plate-like body 2, multiple columnar fine protrusions 13 having a substantially circular sectional shape along the upper surface 2a are provided on the upper surface 2a, for example, at mutually equal intervals, and individual top surfaces 13a of the fine protrusions 13 are parallel to the regions 12 and top surfaces 11a of the protrusions 11.

The diameter of the fine protrusion 13 is preferably 100 μm or less and more preferably 60 μm or less. In addition, the height of the fine protrusion 13 is preferably in a range of 10% or more and 100% or less of the height H of the protrusion 11 and is, for example, in a range of 3 μm or more and 30 μm or less. Furthermore, the interval between the fine protrusions 13 is preferably 20 μm or greater and more preferably 50 μm or greater.

Similar to the protrusion 11, the fine protrusion 13 is not particularly limited as long as the fine protrusion has a volume intrinsic resistivity in a range of approximately $10^{13}$ Ω·cm to $10^{15}$ Ω·cm, has mechanical strength, and furthermore, has durability against oxygen-based plasma or corrosive gas, and the fine protrusion is preferably made of the same material as the ceramic plate-like body 2 when thermal expansion difference, mechanical strength, ease of grinding processing, and the like are taken into account.

As the above-described material, for example, a variety of sintered bodies such as an alumina ($Al_2O_3$) sintered body, an aluminum nitride (AlN) sintered body, and an alumina ($Al_2O_3$)-silicon carbide (SiC) composite sintered body, yttrium compounds such as yttrium oxide ($Y_2O_3$), yttrium aluminum garnet (YAG), yttrium aluminum monoclinic (YAM), and yttrium aluminum perovskite (YAP), solid solutions containing a rare earth element (La, Ce, Pr, Nd, Pm, Sm, Eu, Gd, Tb, Dy, Ho, Er, Tm, Yb, or Lu), and the like can be preferably used.

The total occupancy area of the fine protrusions 13 in the regions 12 excluding the protrusions 11 in the upper surface 2a is preferably in a range of 1% or more and 40% or less, more preferably in a range of 5% or more and 35% or less, and still more preferably in a range of 10% or more and 30% or less of the area of the regions 12.

The reason for setting the fraction of the total occupancy area of the fine protrusions 13 in the regions 12 in a range of 1% or more and 40% or less of the area of the regions 12 is that the effect of the present invention can be exhibited in this range. Meanwhile, when the fraction of the total occupancy area of the fine protrusions 13 in the regions 12 is outside the above-described range, there is no technical meaning of providing the fine protrusions 13 in the regions 12, and it becomes impossible to exhibit the effect of the present invention, which are not preferable.

Figure 3:
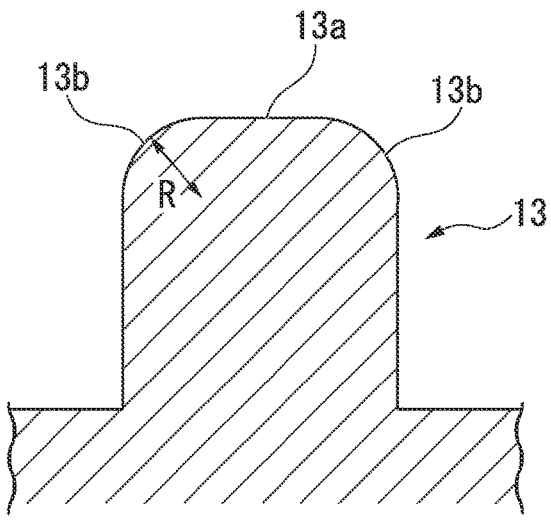
FIG. 3 is an enlarged sectional view illustrating a fine protrusion in the electrostatic chuck device of the first embodiment of the present invention.

As illustrated in FIG. 3, the fine protrusion 13 has a flat top surface 13a in the central portion and a curved portion 13b having a sectional radius of R which is formed at the outer circumferential portion of the top surface 13a.

The number of the fine protrusions 13 provided in the regions 12 is not particularly limited as long as the number is set in a range so that the fraction of the total occupancy area satisfies the above-described range, but is generally in a range of 10 fine protrusions to 20 fine protrusions per unit area of 0.1 mm².

The shape of the fine protrusion 13 is not particularly limited, and a prismatic shape, a circular truncated conic shape, a truncated pyramid shape, or the like can be preferably used in addition to the above-described columnar shape.

In addition, at the circumferential edge portion of the upper surface 2a, a wall portion (not illustrated) which continues along the circumferential edge portion and has the same height as the protrusion 11 is formed throughout the entire circumferential edge portion of the upper surface 2a so as to prevent the leakage of cooling gas such as He.

The electrostatic adsorption electrode 3 is used as an electrostatic chuck electrode for generating charges and fixing the wafer W to the placement surface for the ceramic plate-like body 2 with an electrostatic adsorption force, and thus the shape and size thereof are appropriately adjusted depending on the intended use.

As a material constituting the electrostatic adsorption electrode 3, metals such as gold (Au), silver (Ag), and copper (Cu), which are not magnetic materials, high-melting point metals such as titanium, tungsten, molybdenum, and platinum, carbon materials such as graphite and carbon, conductive ceramic materials such as silicon carbide (SiC), titanium nitride (TiN), titanium carbide (TiC), and tungsten carbide (WC), and cermets such as a TiC—Ni-based cermet, a TiC—Co-based cermet, and a $B_4C$—Fe-based cermet, are preferably used. The thermal expansion coefficients of these materials are desirably as close to the thermal expansion coefficient of the ceramic plate-like body 2 as possible.

The thickness of the electrostatic adsorption electrode 3 is not particularly limited; however, in a case in which the electrostatic adsorption electrode is used as an electrode for generating plasma, the thickness thereof is preferably in a range of 0.1 μm or more and 100 μm or less and particularly preferably in a range of 5 μm or more and 20 μm or less. This is because, when the thickness is below 0.1 μm, it is not possible to ensure sufficient conductive properties and on the other hand, when the thickness exceeds 100 μm, cracks are likely to be generated in the joining interface between the ceramic plate-like body 2 and the electrostatic adsorption electrode 3 due to the difference in thermal expansion rate between the ceramic plate-like body 2 and the electrostatic adsorption electrode 3, it becomes impossible to cover the difference in level between the electrostatic adsorption electrode 3 and the ceramic plate-like body 2 with the organic adhesive layer 5, and the insulating properties in the side face direction degrade.

The electrostatic adsorption electrode 3 having the above-described thickness can be easily formed using a film-forming method such as a sputtering method or a deposition method or a coating method such as a screen printing method.

The electrostatic chuck device has a structure in which the wafer W is placed on the respective top surfaces 11a of the protrusions 11, and a predetermined voltage is applied between the wafer W and the electrostatic adsorption electrode 3, thereby adsorbing and fixing the wafer W onto the respective top surfaces 11a of the protrusions 11 using an electrostatic force.

The organic adhesive layer 5 is a sheet-shaped or film-shaped adhesive made of acryl, epoxy, polyethylene, or the like and is preferably a thermal compression-type organic adhesive sheet or film.

This is because, when the thermal compression-type organic adhesive sheet or film is superimposed on the electrostatic adsorption electrode 3, is evacuated, and then is thermally compressed, air bubbles and the like are not easily generated between the thermal compression-type organic adhesive sheet or film and the electrostatic adsorption electrode 3, and thus the thermal compression-type organic adhesive sheet or film does not easily peel off, and the adsorption characteristics or voltage resistance of the electrostatic chuck portion 4 can be favorably held.

The thickness of the organic adhesive layer 5 is not particularly limited; however, when adhesive strength, ease of handling, and the like are taken into account, the thickness thereof is preferably in a range of 40 μm or more and 100 μm or less and more preferably in a range of 55 μm or more and 100 μm or less.

When the thickness thereof is in a range of 55 μm or more and 100 μm or less, the adhesive strength at the interface between the electrostatic adsorption electrode 3 and the organic adhesive layer is further improved, furthermore, the thickness of the organic adhesive layer 5 becomes more uniform, and consequently, the thermal conductivity becomes uniform between the ceramic plate-like body 2 and the base plate 8, the cooling characteristics of the placed wafer W are made to be uniform, and the in-plane temperature of the wafer W is made to be uniform.

Meanwhile, when the thickness of the organic adhesive layer 5 is below 40 μm, while the thermal conduction properties become favorable between the electrostatic chuck portion 4 and the base portion 8, it becomes impossible to cover the difference in level of the electrostatic adsorption electrode 3 caused by the thermal softening of the adhesive layer, and the organic adhesive layer is likely to peel off at the interface between the electrostatic adsorption electrode 3 and the organic adhesive layer, which are not preferable. On the other hand, when the thickness thereof exceeds 100 μm, it becomes impossible to sufficiently ensure the thermal conduction properties between the electrostatic chuck portion 4 and the base portion 8, and the cooling efficiency is decreased, which are not preferable.

As described above, when the sheet-shaped or film-shaped adhesive is used as the organic adhesive layer 5, the thickness of the organic adhesive layer 5 is made to be uniform, and the thermal conductivity becomes uniform between the ceramic plate-like body 2 and the base portion 8. Therefore, the cooling characteristics of the placed wafer W are made to be uniform, and the in-plane temperature of the wafer W is made to be uniform.

The insulating layer 6 is a sheet-shaped or film-shaped insulating material made of an insulating resin capable of withstanding the voltage applied to the electrostatic chuck portion 2 such as polyimide, polyamide, or aromatic polyamide, and the outer circumferential portion of the insulating layer 6 is inside the outer circumferential portion of the ceramic plate-like body 2.

As described above, when the insulating layer 6 is provided inside the ceramic plate-like body 2, the insulating layer 6 is improved in terms of the plasma resistance to oxygen-based plasma and the corrosion resistance to corrosive gasses, and the generation of particles and the like is suppressed.

The thickness of the insulating layer 6 is preferably in a range of 10 μm or more and 200 μm or less and more preferably in a range of 10 μm or more and 70 μm or less.

This is because, when the thickness of the insulating layer 6 is below 10 μm, the insulating properties with respect to the electrostatic adsorption electrode 3 are degraded, the electrostatic adsorption force is also weakened, and it becomes impossible to favorably fix the wafer W to the placement surface. On the other hand, when the thickness thereof exceeds 200 μm, it becomes impossible to sufficiently ensure the thermal conduction properties between the electrostatic chuck portion 4 and the base portion 8, and the cooling efficiency is decreased.

The organic adhesive layer 7 adheres and fixes the electrostatic chuck portion 4 and the insulating layer 6 to the base portion 8 and protects the electrostatic adsorption electrode 3, the organic adhesive layer 5, and the insulating layer 6 from oxygen-based plasma or corrosive gas by being provided so as to cover these components. The organic adhesive layer is preferably a material having high plasma resistance, high thermal conductivity, and a high cooling efficiency from the base portion 8 and, for example, is preferably a silicone-based resin composition which is a resin having excellent heat resistance and elasticity.

The silicone-based resin composition is a silicon compound having a siloxane bond (Si—O—Si) and can be represented by, for example, Formula (1) or (2) illustrated below.

[Formula 1]

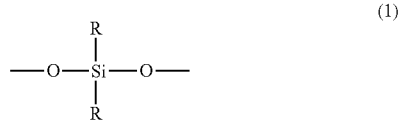

(1)

Here, R represents H or an alkyl group ($C_nH_{2n+1}$—: n is an integer).

[Formula 2]

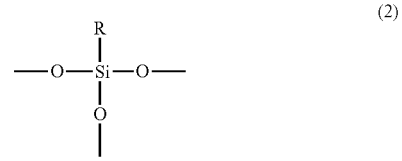

(2)

Here, R represents H or an alkyl group ($C_nH_{2n+1}$—: n is an integer).

As the above-described silicone resin, a silicone resin having a thermal curing temperature in a range of 70° C. to 140° C. is particularly preferably used.

Here, when the thermal curing temperature is below 70° C., when the electrostatic chuck portion 4 and the insulating layer 6 are joined to the base portion 8, curing begins in the middle of the joining process, and there is a concern that hindrance may be caused to the joining operation, which is not preferable. On the other hand, when the thermal curing temperature exceeds 140° C., it is not possible to absorb the thermal expansion difference between the electrostatic chuck portion 4 and the insulating layer 6 and the base portion 8, the degree of flatness in the placement surface for the ceramic plate-like body 2 is decreased, the joining force between the electrostatic chuck portion 4 and the insulating layer 6 and the base portion 8 is weakened, and there is a concern that the electrostatic chuck portion 4 and the insulating layer 6 may peel off from the base portion 8, which is not preferable.

The thermal conductivity of the organic adhesive layer 7 is preferably 0.25 W/mk or greater and more preferably 0.5 W/mk or greater.

Here, the reason for limiting the thermal conductivity of the organic adhesive layer 7 to 0.25 W/mk or greater is that, when the thermal conductivity is lower than 0.25 W/mk, the cooling efficiency from the base portion 8 is decreased, and it becomes impossible to efficiently cool the wafer W placed on the upper surface 2a of the electrostatic chuck portion 4.

The thickness of the second organic adhesive layer 7 is preferably in a range of 50 μm or more and 300 μm or less and more preferably in a range of 100 μm or more and 200 μm or less.

This is because, when the thickness of the second organic adhesive layer 7 is below 50 μm, the second organic adhesive layer is too thin, and consequently, it becomes impossible to sufficiently ensure the adhesive strength, and there is a concern that the insulating layer 6 and the electrostatic chuck portion 4 may peel off from the base portion 8, and on the other hand, when the thickness thereof exceeds 300 μm, it becomes impossible to sufficiently ensure the thermal conduction properties between the insulating layer 6 and the electrostatic chuck portion 4 and the base portion 8, and the cooling efficiency is decreased.

Furthermore, when the thermal conductivity of the organic adhesive layer 5 and the thermal conductivity of the insulating layer 6 are set to be equal to or lower than the thermal conductivity of the organic adhesive layer 7, it is possible to suppress the temperature increase in the organic adhesive layer 7 and to diminish the unevenness of the in-plane temperature caused by the unevenness of the thickness of the organic adhesive layer 7, and consequently, it is possible to make the temperature of the wafer W to be placed on the upper surface uniform and to make the in-plane temperature of the wafer W uniform, which is preferable.

The organic adhesive layer 7 preferably includes a filler having an average particle diameter in a range of 1 μm or more and 10 μm or less, for example, surface-coated aluminum nitride (AlN) particles having a silicon oxide ($SiO_2$) coating layer formed on the surface of an aluminum nitride (AlN) particle.

The surface-coated aluminum nitride (AlN) particles are injected in order to improve the thermal conduction properties of the silicone resin, and the thermal conductivity of the organic adhesive layer 7 can be controlled by adjusting the injection ratio thereof.

The base portion 8 is a portion for adjusting the electrostatic chuck portion 4 in a desired temperature pattern through cooling, thereby cooling the wafer W to be placed on the upper surface and adjusting the temperature thereof. The base portion is a thick disc-shaped body, and the structural framework of the base portion is connected to an external high-frequency power supply (not illustrated). Inside the base portion 8, as necessary, a flow path for circulating water or an insulating coolant for cooling or temperature adjustment is formed.

In addition, in some cases, a flow path for circulating a heating medium such as He gas or $N_2$ gas between the adsorption surface and the wafer is also formed.

The material for constituting the base portion 8 is not particularly limited as long as the material is either a metal or a metal-ceramic composite material having excellent thermal conduction properties, electric conduction properties, and workability, and, for example, aluminum (Al), copper (Cu), stainless steel (SUS), and the like can be preferably used. The side surface of the base portion 8, that is, at least the surface being exposed to plasma is preferably coated through an alumite treatment or using an insulating thermal spray material such as alumina or yttria.

In the base portion 8, when an alumite treatment is carried out or an insulating film is formed on at least the surface being exposed to plasma, the plasma resistance improves, and abnormal discharging is prevented, and thus the plasma resistance stability of the base portion is improved. In addition, since scratches are not easily generated on the surface, it is possible to prevent the generation of scratches.

Next, a method for manufacturing the electrostatic chuck device 1 will be described.

First, the electrostatic chuck portion 4 and the base portion 8 are produced using a well-known method.

The electrostatic chuck portion 4 can be obtained by degreasing and washing the lower surface 2b of the ceramic plate-like body 2 using, for example, acetone and forming the electrostatic adsorption electrode 3 on the lower surface 2b using a film-forming method such as a sputtering method or a deposition method or a coating method such as a screen printing method. The thickness of the ceramic plate-like body 2 is preferably set in consideration of the amount of the ceramic plate-like body to be ground after the attachment of the base portion 8.

In addition, the base portion 8 can be obtained by machining either a metallic material or a metal-ceramic composite material, carrying out an alumite treatment or forming an insulating film as necessary, and then carrying out degreasing and washing using, for example, acetone.

Next, a sheet-shaped or film-shaped organic adhesive and a sheet-shaped or film-shaped insulating material are prepared, and the organic adhesive and the insulating material are temporarily adhered together using a lamination device, thereby producing a sheet-shaped or film-shaped organic adhesive-attached insulating material.

Next, the organic adhesive-attached insulating material is punched using a pressing device, thereby producing a piece having a diameter smaller than the ceramic plate-like body 2.

Next, the punched-out organic adhesive-attached insulating material is attached to the electrostatic adsorption electrode 3 in the electrostatic chuck portion 4, and is heated and pressurized (thermally compressed) at the same time using a thermal compression device such as a vacuum hot pressing device at atmospheric pressure or a reduced pressure of 1 Pa or lower, and the organic adhesive layer 5 and the insulating layer 6 are thermally compressed on the electrostatic adsorption electrode 3 in the electrostatic chuck portion 4.

Next, the joining surface between the base portion 8 and the insulating layer 6 on the electrostatic chuck portion 4 is degreased and washed using, for example, acetone, and a silicone-based resin composition is applied onto the joining surface using, for example, a bar coater so as to obtain a constant thickness.

Next, the insulating layer 6 on the electrostatic chuck portion 4 is placed on the coated surface, and the silicone-based resin composition is cured. Therefore, the cured body of the silicone resin composition serves as the organic adhesive layer 7.

Next, the upper surface 2a of the ceramic plate-like body 2 is ground so as to adjust the thickness of the ceramic plate-like body 2 to a desired thickness, and dotting is carried out on the upper surface 2a of the ceramic plate-like body 2 so as to respectively form the protrusions 11 on the upper surface 2a and the fine protrusions 13 in the regions 12 excluding the protrusions 11 in the upper surface 2a, and the upper surfaces 11a of the protrusions 11 are used as the placement surface on which the wafer W is placed.

Through the above-described steps, the electrostatic chuck device 1 of the present embodiment can be obtained.

As described above, according to the electrostatic chuck device 1 of the present embodiment, since the multiple protrusions 11 are formed on the upper surface 2a of the ceramic plate-like body 2 and the multiple fine protrusions 13 are formed in the regions 12 excluding the multiple protrusions 11 in the upper surface 2a, the generation of particles on the upper surface 2a can be suppressed using the fine protrusions 13, and thus it is possible to further suppress the attachment of particles to the rear surface of the wafer W. Furthermore, it is possible to improve the effect of cooling the wafer W using a cooling gas.

In addition, since the electrostatic chuck portion is constituted with the ceramic plate-like body 2 having the upper surface 2a that is used as the placement surface on which the wafer W is placed and the electrostatic adsorption electrode 3 provided on the lower surface 2b side of the ceramic plate-like body 2, the insulating layer 6 is adhered to the electrostatic adsorption electrode 3 through the organic adhesive layer 5, and the base plate 8 is adhered to the insulating layer 6 through the organic adhesive layer 7, the electrostatic adsorption electrode 3 is doubly protected with the organic adhesive layer 5 and the insulating layer 6, and thus it is possible to improve the insulating resistance of the base plate 8 and the side surface. Therefore, the frequency of breakage due to discharging or the like during use is low, and it is also possible to decrease the amount of particles generated in case of breakage.

Figure 4:
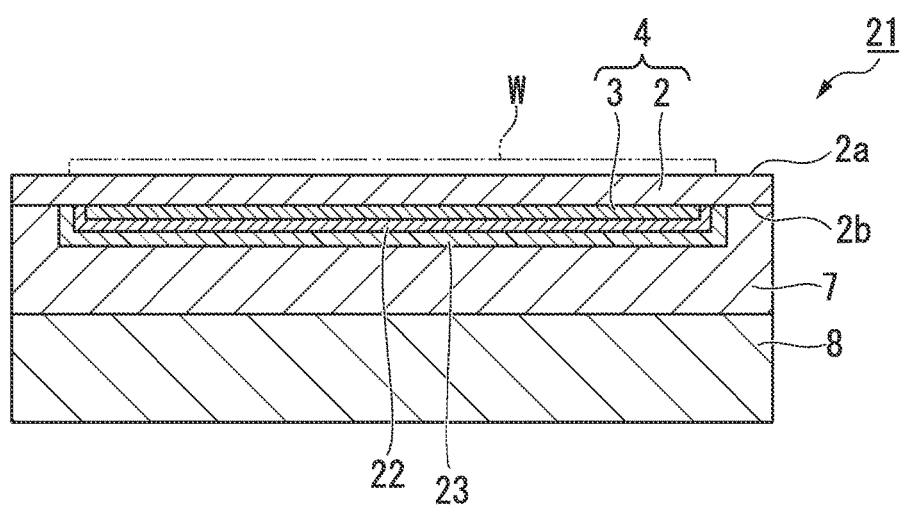
FIG. 4 is a sectional view illustrating a modification example of the electrostatic chuck device of the first embodiment of the present invention.

FIG. 4 is a sectional view illustrating a modification example of the electrostatic chuck device of the present embodiment, and the differences in an electrostatic chuck device 21 from the above-described electrostatic chuck device 1 are that a sheet-shaped or film-shaped (first) organic adhesive layer 22 is formed so as to cover the lower surface and the side surfaces of the electrostatic adsorption electrode 3, a sheet-shaped or film-shaped insulating layer 23 is adhered so as to cover the lower surface and the side surfaces of the organic adhesive layer 22, and the base portion 8 for supporting the electrostatic chuck portion 4 and cooling the wafer W is adhered to the sheet-shaped or film-shaped insulating layer 23 and the electrostatic chuck portion 4 through the organic adhesive layer 7.

In the electrostatic chuck device 21, as illustrated in FIGS. 2 and 3, the multiple protrusions 11 are formed on the upper surface 2a of the ceramic plate-like body 2 and the multiple fine protrusions 13 are formed in the regions 12 excluding the multiple protrusions 11 in the upper surface 2a.

Therefore, in the electrostatic chuck device 21 as well, similar to the electrostatic chuck device 1, the generation of particles on the upper surface 2a can be suppressed using the fine protrusions 13, and thus it is possible to further suppress the attachment of particles to the rear surface of the wafer W. Furthermore, it is possible to improve the effect of cooling the wafer W using a cooling gas.

Furthermore, since the sheet-shaped or film-shaped organic adhesive layer 22 is formed so as to cover the lower surface and the side surfaces of the electrostatic adsorption electrode 3, and the sheet-shaped or film-shaped insulating layer 23 is adhered so as to cover the lower surface and the side surfaces of the organic adhesive layer 22, it is possible to improve the voltage resistance of the electrostatic adsorption electrode 3.

Second Embodiment

Figure 5:
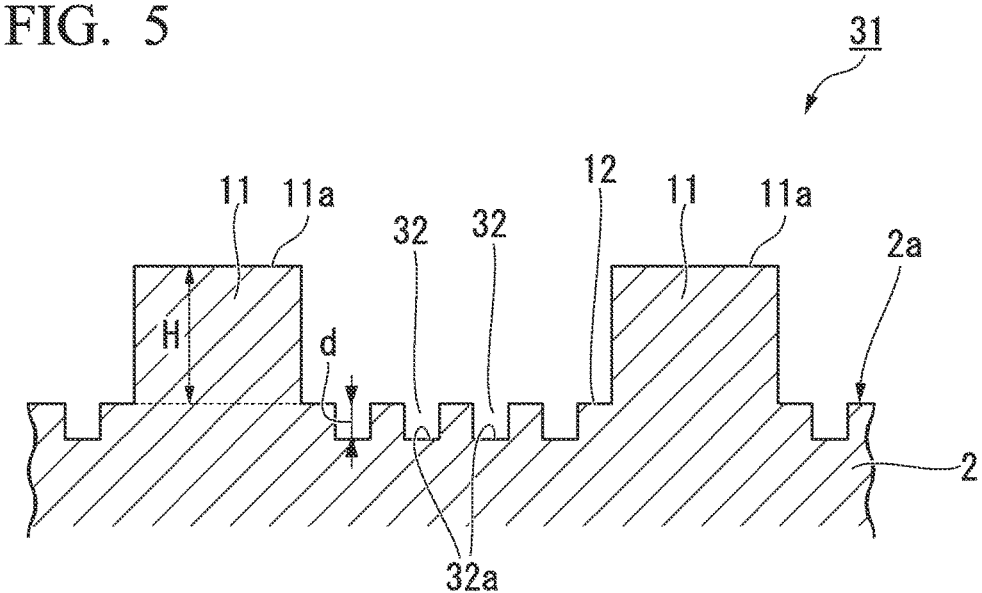
FIG. 5 is an enlarged sectional view illustrating the periphery of the upper surface of a ceramic plate-like body in an electrostatic chuck device of a second embodiment of the present invention.

FIG. 5 is an enlarged sectional view illustrating the periphery of the upper surface of a ceramic plate-like body in an electrostatic chuck device of a second embodiment of the present invention. The difference in an electrostatic chuck device 31 of the present embodiment from the electrostatic chuck device 1 of the first embodiment is that, while the multiple fine protrusions 13 are provided in the regions 12 excluding the protrusions 11 in the upper surface 2a of the ceramic plate-like body 2 in the electrostatic chuck device 1 of the first embodiment, in the electrostatic chuck device 31 of the present embodiment, multiple fine recesses 32 are provided in the regions 12 excluding the protrusions 11 in the upper surface 2a of the ceramic plate-like body 2 instead of the multiple fine protrusions 13, and the remaining parts are totally the same as those of the electrostatic chuck device 1 of the first embodiment, and thus will not be described.

Regarding the fine recesses 32, the multiple columnar fine recesses 32 having a substantially circular sectional shape along the upper surface 2a are provided in the regions 12 excluding the protrusions 11 in the upper surface 2a of the ceramic plate-like body 2, for example, at mutually equal intervals, and individual bottom surfaces 32a of the fine recesses 32 are parallel to the regions 12 and the top surfaces 11a of the protrusions 11.

The diameter (opening diameter) of an opening portion of the fine recess 32 is preferably 100 µm or less and more preferably 60 µm or less. In addition, the depth d of the fine recess 32 is preferably in a range of 10% or more and 100% or less of the height H of the protrusion 11 and is, for example, in a range of 3 µm or more and 30 µm or less. Furthermore, the interval between the fine recesses 32 is preferably 20 µm or greater and more preferably 60 µm or greater.

The total occupancy area of the fine recesses 32 in the regions 12 excluding the protrusions 11 in the upper surface 2a is preferably in a range of 1% or more and 40% or less, more preferably in a range of 5% or more and 35% or less, and still more preferably in a range of 10% or more and 30% or less of the area of the regions 12.

The reason for setting the fraction of the total occupancy area of the fine recesses 32 in the regions 12 in a range of 1% or more and 40% less of the area of the regions 12 is that the effect of the present invention can be exhibited in this range. Meanwhile, when the fraction of the total occupancy area of the fine recesses 32 in the regions 12 is outside the above-described range, there is no technical meaning of providing the fine recesses 32 in the regions 12, and it becomes impossible to exhibit the effect of the present invention, which are not preferable.

Figure 6:
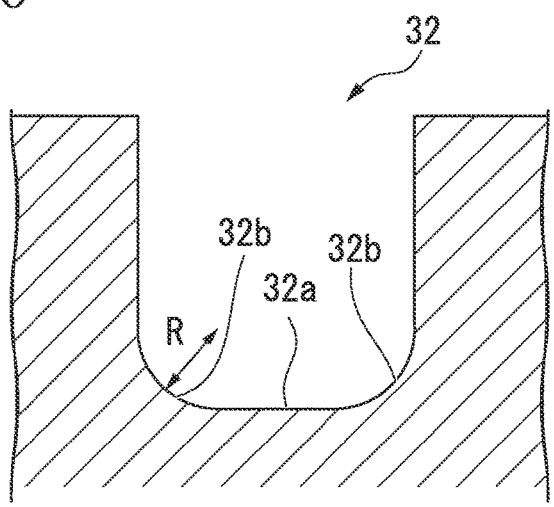
FIG. 6 is an enlarged sectional view illustrating a fine recess in the electrostatic chuck device of the second embodiment of the present invention.

As illustrated in FIG. 6, the fine recess 32 has a flat bottom surface 32a in the central portion and a curved portion 32b having a sectional radius of R which is formed at the outer circumferential portion of the bottom surface 32a.

The number of the fine recesses 32 provided in the regions 12 is not particularly limited as long as the number is set in a range so that the fraction of the total occupancy area satisfies the above-described range, but is generally in a range of 10 fine recesses to 20 fine recesses per unit area of 0.1 mm$^2$.

The shape of the fine recess 32 is not particularly limited, and a square-tube shape, a mortar shape, a V-letter shape, or the like can be preferably used in addition to the above-described columnar shape.

The fine recesses 32 can be obtained by, in the method for manufacturing the electrostatic chuck device 1 of the first embodiment, grinding the upper surface 2a of the ceramic plate-like body 2 so as to adjust the thickness of the ceramic plate-like body 2 to a desired thickness, and dotting the upper surface 2a of the ceramic plate-like body 2 so as to respectively form the protrusions 11 on the upper surface 2a of the ceramic plate-like body 2 and the fine recesses 32 in the regions 12 excluding the protrusions 11 in the upper surface 2a.

In the electrostatic chuck device 31 of the present embodiment as well, similar to the electrostatic chuck device 1 of the first embodiment, the generation of particles on the upper surface 2a can be suppressed using the fine recesses 32, and thus it is possible to further suppress the attachment of particles to the rear surface of the wafer W. Furthermore, it is possible to improve the effect of cooling the wafer W using a cooling gas.

Meanwhile, the fact that the multiple fine recesses 32 are provided in the regions 12 excluding the protrusions 11 in the upper surface 2a of the ceramic plate-like body 2 instead of the multiple fine protrusions 13 can also be applied to the above-described electrostatic chuck device 21, and it is possible to exhibit totally the same effect as that of the electrostatic chuck device 31 of the present embodiment.

Third Embodiment

Figure 7:
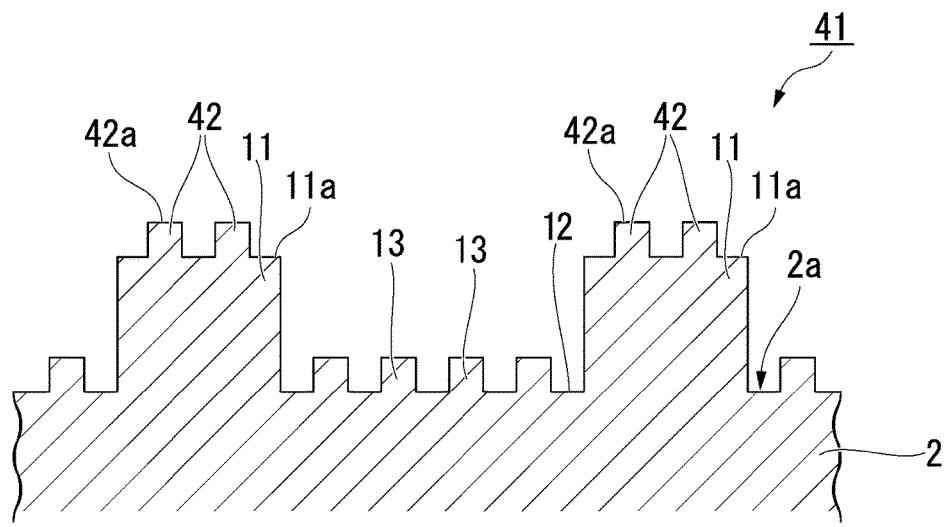
FIG. 7 is an enlarged sectional view illustrating the periphery of the upper surface of a ceramic plate-like body in an electrostatic chuck device of a third embodiment of the present invention.

FIG. 7 is an enlarged sectional view illustrating the periphery of the upper surface of a ceramic plate-like body in an electrostatic chuck device of a third embodiment of the present invention. The difference in an electrostatic chuck device 41 of the present embodiment from the electrostatic chuck device 1 of the first embodiment is that, while the multiple fine protrusions 13 are provided in the regions 12 excluding the protrusions 11 in the upper surface 2a of the ceramic plate-like body 2 in the electrostatic chuck device 1 of the first embodiment, in the electrostatic chuck device 41 of the present embodiment, the multiple fine protrusions 13 are provided in the regions 12 excluding the protrusions 11 in the upper surface 2a of the ceramic plate-like body 2, and furthermore, multiple (second) fine protrusions 42 are provided on the top surfaces (upper end portions) 11a of the protrusions 11, and the remaining parts are totally the same as those of the electrostatic chuck device 1 of the first embodiment, and thus will not be described.

The fine protrusion 42 is preferably made of the same material as the fine protrusion 13 in terms of thermal expansion difference, mechanical characteristics, and the like.

Individual top surfaces 42a of the fine protrusions 42 are parallel to the top surfaces 11a of the protrusions 11.

The diameter of the fine protrusion 42 is preferably 60 µm or less and more preferably 45 µm or less. In addition, the height of the fine protrusion 42 is preferably in a range of 10% or more and 100% or less of the height H of the protrusion 11 and is, for example, in a range of 3 µm or more and 30 µm or less. Furthermore, the interval between the fine protrusions 42 is preferably 20 µm or greater and more preferably 60 µm or greater.

The total occupancy area of the fine protrusions 42 in the top surfaces 11a of the protrusions 11 is preferably in a range of 1% or more and 40% or less, more preferably in a range of 5% or more and 35% or less, and still more preferably in a range of 10% or more and 30% or less of the area of the top surfaces 11a.

By setting the fraction of the total occupancy area of the fine protrusions 42 in the top surfaces 11a of the protrusions 11 in the above-described range, it becomes easy for impurities, contaminants and the like attached to the rear surface of the wafer to be peeled off from the wafer, and abnormal heat generation from the wafer can be prevented.

In the electrostatic chuck device 41 of the present embodiment as well, similar to the electrostatic chuck device 1 of the first embodiment, the generation of particles on the upper surface 2a can be suppressed using the fine protrusions 13, and thus it is possible to further suppress the attachment of particles to the rear surface of the wafer W. Furthermore, it is possible to improve the effect of cooling the wafer W using a cooling gas.

Furthermore, since the multiple fine protrusions 42 are provided on the top surfaces 11a of the protrusions 11, it becomes easy for impurities, contaminants and the like attached to the rear surface of the wafer to be peeled off from the wafer, and abnormal heat generation from the wafer can be prevented.

Meanwhile, the facts that the multiple fine protrusions 13 are provided in the regions 12 excluding the protrusions 11 in the upper surface 2a of the ceramic plate-like body 2 and, furthermore, the multiple fine protrusions 42 are provided on the top surfaces 11a of the protrusions 11 can also be applied to the above-described electrostatic chuck device 21, and it is possible to exhibit totally the same effect as that of the electrostatic chuck device 41 of the present embodiment.

Fourth Embodiment

Figure 8:
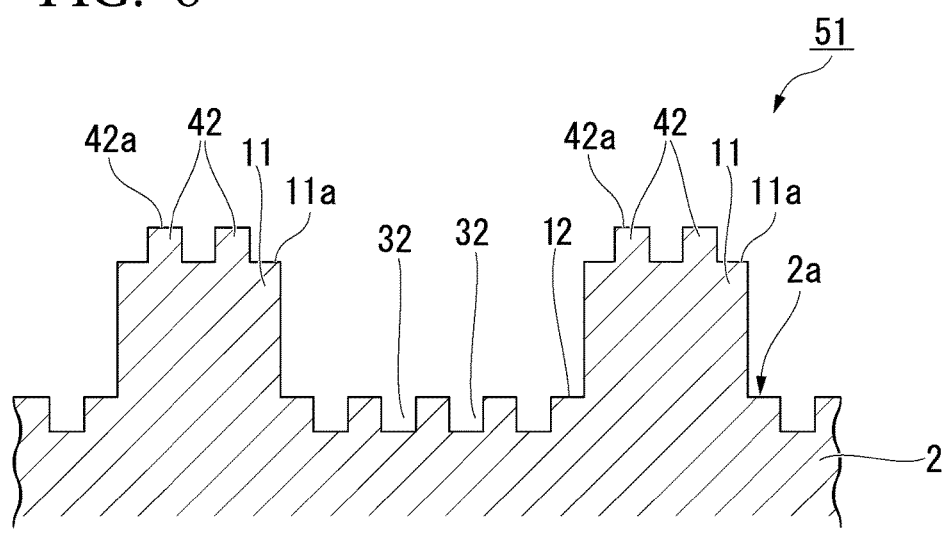
FIG. 8 is an enlarged sectional view illustrating the periphery of the upper surface of a ceramic plate-like body in an electrostatic chuck device of a fourth embodiment of the present invention.

FIG. 8 is an enlarged sectional view illustrating the periphery of the upper surface of a ceramic plate-like body in an electrostatic chuck device of a fourth embodiment of the present invention. The difference in an electrostatic chuck device 51 of the present embodiment from the electrostatic chuck device 31 of the second embodiment is that, while the multiple fine recesses 32 are provided in the regions 12 excluding the protrusions 11 in the upper surface 2a of the ceramic plate-like body 2 in the electrostatic chuck device 31 of the second embodiment, in the electrostatic chuck device 51 of the present embodiment, the multiple fine recesses 32 are provided in the regions 12 excluding the protrusions 11 in the upper surface 2a of the ceramic plate-like body 2, and furthermore, the multiple (second) fine protrusions 42 are provided on the top surfaces (upper end portions) 11a of the protrusions 11, and the shape, material, and the like of the fine protrusion 42 and the other parts are totally the same as those of the electrostatic chuck devices 31 and 41 of the second and third embodiments, and thus will not be described.

In the electrostatic chuck device 51 of the present embodiment as well, similar to the electrostatic chuck device 31 of the second embodiment, the generation of particles on the upper surface 2a can be suppressed using the fine recesses 32, and thus it is possible to further suppress the attachment of particles to the rear surface of the wafer W. Furthermore, it is possible to improve the effect of cooling the wafer W using a cooling gas.

Furthermore, since the multiple fine protrusions 42 are provided on the top surfaces 11a of the protrusions 11, it becomes easy for impurities, contaminants and the like attached to the rear surface of the wafer to be peeled off from the wafer, and abnormal heat generation from the wafer can be prevented.

Meanwhile, the facts that the multiple fine recesses 32 are provided in the regions 12 excluding the protrusions 11 in the upper surface 2a of the ceramic plate-like body 2 and, furthermore, the multiple fine protrusions 42 are provided on the top surfaces 11a of the protrusions 11 can also be applied to the above-described electrostatic chuck device 21, and it is possible to exhibit totally the same effect as that of the electrostatic chuck device 51 of the present embodiment.

EXAMPLES

Hereinafter, the present invention will be specifically described using examples and comparative examples, but the present invention is not limited to these examples.

Example 1

First, a ceramic plate-like body 2 made of an $Al_2O_3$—SiC composite sintered body containing 8% by mass of SiC was prepared. The ceramic plate-like body 2 was a disc-shaped body having a diameter of 298 mm and a thickness of 2 mm.

The lower surface of the ceramic plate-like body 2 was degreased and washed using acetone, and conductive paste FC415 (manufactured by Fujikura Kasei Co., Ltd.) was applied to the lower surface using a screen printing method, was fired for 10 hours at 300° C. at atmospheric pressure, thereby forming a 10 µm-thick electrostatic adsorption electrode, which was used as the electrostatic chuck portion.

In addition, an aluminum base portion having an alumite-treated surface was prepared. The base portion was a disc-shaped body having a diameter of 395 mm and a thickness of 29 mm.

Next, a 50 µm-thick polyimide film 200H (manufactured by Du Pont-Toray Co., Ltd.) serving as the insulating layer and a 60 µm-thick epoxy-based thermal adhesion sheet serving as the organic adhesive layer 5 were prepared and were temporarily adhered together using a roll laminator (lamination device) at 80° C., thereby producing an organic adhesive-attached insulating film.

Next, the organic adhesive-attached insulating film was punched using a forming machine, thereby producing a piece having a diameter smaller than the ceramic plate-like body 2.

Next, this punched-out organic adhesive-attached insulating film was attached to the electrostatic adsorption electrode in the electrostatic chuck portion, and was thermally compressed using a vacuum hot pressing device at a reduced pressure of 1 Pa or lower under conditions of 160° C. and 5 MPa, and the organic adhesive-attached insulating film was thermally compressed onto the electrostatic adsorption electrode in the electrostatic chuck portion.

Since the organic adhesive-attached insulating film allowed visible light rays to pass through, the presence or absence of air bubbles could be easily checked.

Next, the joining surface between the base portion and the electrostatic chuck portion was degreased and washed using acetone, and a silicon resin containing 30% by volume of aluminum nitride (AlN), which was a silicone-based resin composition, (AlN30v/v %-silicon resin) was applied onto the joining surface using a bar coater in a thickness of 200 µm.

Next, the electrostatic chuck portion was placed on the coated surface, and the AlN30 v/v %-silicon resin was cured, thereby adhering and fixing the base portion and the electrostatic chuck portion together.

Next, the upper surface of the electrostatic chuck portion was ground so as to adjust the thickness of the ceramic plate-like body to 0.5 mm, and dotting was carried out on the upper surface of the ceramic plate-like body so as to form columnar protrusions having a diameter of 500 μm and a height of 15 μm and columnar fine protrusions having a diameter of 40 μm and a height of 10 μm on the upper surface so that the total occupancy area of the fine protrusions in the regions excluding the protrusions in the upper surface reached 20%, thereby producing an electrostatic chuck device of Example 1.

In this electrostatic chuck device, the surface roughness Ra in the regions excluding the protrusions in the upper surface was 1.1 μm.

As a result of carrying out plasma etching on a silicon wafer using the electrostatic chuck device, it could be confirmed that the generation of particles was suppressed. Furthermore, the in-plane temperature variation in the surface of the silicon wafer was in a range of ±1.5° C., and the cooling effect of a cooling gas could be confirmed.

Example 2

An electrostatic chuck device of Example 2 was produced in the same manner as in Example 1 except for the fact that columnar protrusions having a diameter of 500 μm and a height of 15 μm and columnar fine recesses having a diameter of 40 μm and a depth of 10 μm were formed on the upper surface of the ceramic plate-like body so that the total occupancy area of the fine recesses in the regions excluding the protrusions in the upper surface reached 30%.

In this electrostatic chuck device, the surface roughness Ra in the regions excluding the protrusions in the upper surface was 2.1 μm.

As a result of carrying out plasma etching on a silicon wafer using the electrostatic chuck device, it could be confirmed that the generation of particles was suppressed. Furthermore, the in-plane temperature variation in the surface of the silicon wafer was in a range of ±1° C., and the cooling effect of a cooling gas could be confirmed.

Example 3

An electrostatic chuck device of Example 3 was produced in the same manner as in Example 1 except for the fact that columnar protrusions having a diameter of 500 μm and a height of 15 μm and columnar fine protrusions having a diameter of 40 μm and a height of 10 μm were formed on the upper surface of the ceramic plate-like body so that the total occupancy area of the fine protrusions in the regions excluding the protrusions in the upper surface reached 20% and, furthermore, 45 columnar fine protrusions having a diameter of 40 μm and a height of 4 μm were formed on the top surfaces of the protrusions.

In this electrostatic chuck device, the surface roughness Ra in the regions excluding the protrusions in the upper surface was 1.3 μm. In addition, the total occupancy area of the fine protrusions formed on the top surface of the protrusions in the top surfaces was 29% of the area of the top surfaces.

As a result of carrying out plasma etching on a silicon wafer using the electrostatic chuck device, it could be confirmed that the generation of particles was suppressed. Furthermore, the in-plane temperature variation in the surface of the silicon wafer was in a range of ±1° C., and the cooling effect of a cooling gas could be confirmed.

Example 4

An electrostatic chuck device of Example 4 was produced in the same manner as in Example 1 except for the fact that columnar protrusions having a diameter of 500 μm and a height of 15 μm and columnar fine recesses having a diameter of 40 μm and a depth of 10 μm were formed on the upper surface of the ceramic plate-like body so that the total occupancy area of the fine recesses in the regions excluding the protrusions in the upper surface reached 20% and, furthermore, 20 columnar fine protrusions having a diameter of 40 μm and a height of 5 μm were formed on the top surfaces of the protrusions.

In this electrostatic chuck device, the surface roughness Ra in the regions excluding the protrusions in the upper surface was 2.3 μm. In addition, the total occupancy area of the fine protrusions formed on the top surface of the protrusions in the top surfaces was 13% of the area of the top surfaces.

As a result of carrying out plasma etching on a silicon wafer using the electrostatic chuck device, it could be confirmed that the generation of particles was suppressed. Furthermore, the in-plane temperature variation in the surface of the silicon wafer was in a range of ±0.5° C., and the cooling effect of a cooling gas could be confirmed.

Comparative Example

An electrostatic chuck device of a comparative example was produced in the same manner as in Example 1 except for the fact that protrusions and fine protrusion were not formed on the upper surface of the ceramic plate-like body.

As a result of carrying out plasma etching on a silicon wafer using the electrostatic chuck device, it was confirmed that particles were attached to the rear surface of the silicon wafer. Furthermore, it could be confirmed that the in-plane temperature variation in the surface of the silicon wafer was as great as ±3° C., and the cooling effect of a cooling gas was not sufficient.

INDUSTRIAL APPLICABILITY

The present invention can be applied to an electrostatic chuck device capable of suppressing the generation source of particles, further suppressing the attachment of particles to the rear surface of the plate-like specimen, and accordingly, improving the effect of cooling the plate-like specimen using a cooling gas.

REFERENCE SIGNS LIST

1 ELECTROSTATIC CHUCK DEVICE
2 CERAMIC PLATE-LIKE BODY
2a UPPER SURFACE (ONE MAIN SURFACE)
2b LOWER SURFACE (OTHER MAIN SURFACE)
3 ELECTROSTATIC ADSORPTION ELECTRODE
4 ELECTROSTATIC CHUCK PORTION
5 (FIRST) ORGANIC ADHESIVE LAYER
6 INSULATING LAYER
7 (SECOND) ORGANIC ADHESIVE LAYER
8 BASE PORTION (BASE PLATE)
11 PROTRUSION
12 REGION EXCLUDING PROTRUSIONS
13 FINE PROTRUSION

21 ELECTROSTATIC CHUCK DEVICE
22 (FIRST) ORGANIC ADHESIVE LAYER
23 INSULATING LAYER
31 ELECTROSTATIC CHUCK DEVICE
32 FINE RECESS
41 ELECTROSTATIC CHUCK DEVICE
42 (SECOND) FINE PROTRUSION
51 ELECTROSTATIC CHUCK DEVICE

The invention claimed is:

1. An electrostatic chuck device formed by including an electrostatic chuck portion in which a first main surface of a ceramic plate-like body is used as a placement surface on which a plate-like specimen is placed and an electrostatic adsorption electrode is provided inside the ceramic plate-like body or on a second main surface thereof,
wherein multiple protrusions are formed on the first main surface,
multiple fine protrusions or multiple fine recesses are formed in regions excluding the multiple protrusions on the first main surface, the shape of the fine protrusion is one of a columnar shape, a prismatic shape, a circular truncated conic shape, or a truncated pyramid shape, and the shape of the fine recess is one of a columnar shape, a square-tube shape, a mortar shape, or a V-letter shape, and
the multiple fine protrusions or multiple fine recesses are provided at mutually equal intervals,
wherein a total height of the fine protrusion or a total depth of the fine recess is less than a total height of the protrusion.

2. The electrostatic chuck device according to claim 1, wherein the total occupancy area of the multiple fine protrusions or the multiple fine recesses in the regions excluding the multiple protrusions on the first main surface is in a range of 1% or more and 40% or less of an area of the regions.

3. The electrostatic chuck device according to claim 1, wherein the height of the fine protrusion or the depth of the fine recess is in a range of 10% or more and 100% or less of the height of the protrusion.

4. The electrostatic chuck device according to claim 1, wherein multiple second fine protrusions are formed on individual top end portions of the multiple protrusions.

5. The electrostatic chuck device according to claim 1, wherein the surface roughness Ra of regions excluding the multiple protrusions on the first main surface is greater than 1 μm.

6. The electrostatic chuck device according to claim 1, wherein the electrostatic chuck portion includes the electrostatic adsorption electrode on the second main surface of the ceramic plate-like body,
a sheet-shaped or film-shaped insulating layer is adhered to the electrostatic adsorption electrode through a sheet-shaped or film-shaped first organic adhesive layer, and
a base plate supporting the ceramic plate-like body is adhered to the insulating layer through a second organic adhesive layer.

* * * * *